(12) United States Patent
Okada

(10) Patent No.: US 6,448,652 B1
(45) Date of Patent: Sep. 10, 2002

(54) INTERCONNECT STRUCTURE WITH A DIELECTRIC LAYER CONFORMING TO THE PERIMETER OF A WIRING LAYER

(75) Inventor: Norio Okada, Tokyo (JP)

(73) Assignee: NEC Corporation, Tokyo (JP)

( * ) Notice: Subject to any disclaimer, the term of this patent is extended or adjusted under 35 U.S.C. 154(b) by 1 day.

(21) Appl. No.: 09/626,120

(22) Filed: Jul. 26, 2000

Related U.S. Application Data (62) Division of application No. 09/320,466, filed on May 27, 1999, now Pat. No. 6,268,279.

(30) Foreign Application Priority Data

Jun. 1, 1998 (JP) .............................. 10-151552

(51) Int. Cl.⁷ ................................................ H01L 23/48
(52) U.S. Cl. ....................... 257/758; 257/740; 257/744; 257/750; 257/751; 257/752; 257/759; 257/760
(58) Field of Search ................................ 257/740, 744, 257/750–752, 758–760

(56) References Cited

U.S. PATENT DOCUMENTS

| | | |
|---|---|---|
| 4,789,648 A | 12/1988 | Chow et al. |
| 5,378,652 A * | 1/1995 | Samata et al. ............... 257/774 |
| 5,476,814 A * | 12/1995 | Ohshima et al. ............. 437/195 |
| 5,856,707 A * | 1/1999 | Sardella ....................... 257/758 |

FOREIGN PATENT DOCUMENTS

| | | |
|---|---|---|
| JP | 1-117342 | 5/1989 |
| JP | 23228 | 1/1990 |
| JP | 4-260328 | 9/1992 |
| JP | 5-13593 | 1/1993 |
| JP | 11-87492 | 3/1999 |
| JP | 11-317451 | 11/1999 |

* cited by examiner

*Primary Examiner*—Fetsum Abraham
(74) *Attorney, Agent, or Firm*—Young & Thompson (57) ABSTRACT

A first interlayer insulating film and an etching stopper film are sequentially formed on a semiconductor substrate with a surface area on which first wiring is formed. The etching stopper film is patterned so as to correspond to a pattern of via hole formed on the first interlayer insulating film and a pattern of forming a second wiring. A second interlayer insulating film is formed on the etching stopper film. For forming the second wiring, a wiring trench is formed by etching the second interlayer insulating film. Continuously, the via hole Is formed by etching the first interlayer insulating film while having the etching stopper film as a photomask. Conductive materials are laid in the via hole and the wiring trench so that the second wiring connected to the first wiring is formed.

16 Claims, 7 Drawing Sheets

☐ AREA 1 ; ▨ AREA 2

INTERCONNECT STRUCTURE WITH A DIELECTRIC LAYER CONFORMING TO THE PERIMETER OF A WIRING LAYER

CROSS-REFERENCE TO RELATED APPLICATIONS

This application is a division of application Ser. No. 09/320,466, filed May 27, 1999. U.S. Pat. No. 6,268,279.

BACKGROUND OF THE INVENTION

1. Field of the Invention

The present invention relates to a semiconductor device and a manufacturing method of the same, more particularly to a method of manufacturing a semiconductor device whose parasitic capacity between wiring is small, and to a semiconductor device.

2. Description of the Related Art

Of the prior art methods of forming wiring of a semiconductor device, there is a well-known technique for processing trench wiring. According to this technique, a trench having a wiring pattern in an interlayer insulating film is formed and the trench is filled with conductive materials, such as a metal and the like. In such a technique for processing the trench wiring, an etching stopper film is used so that the to-be-formed trenches have the same depths uniformly. In general, as the etching stopper film, a silicon nitride film as an insulating film is used (U.S. Pat. No. 4,789,648).

FIGS. 7A to 7F are diagrams each showing a manufacturing step of a semiconductor device by applying the technique for processing trench wiring with using the etching stopper film.

Figure 7A:
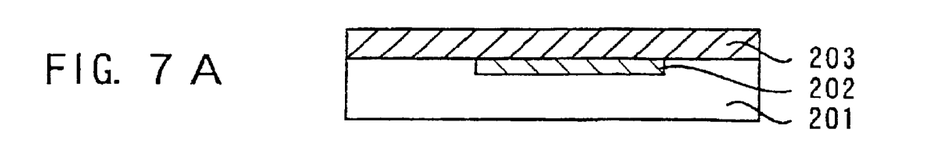
FIGS. 7A to 7F are diagrams each exemplifying a conventional manufacturing step of the semiconductor device.
Figure 7B:
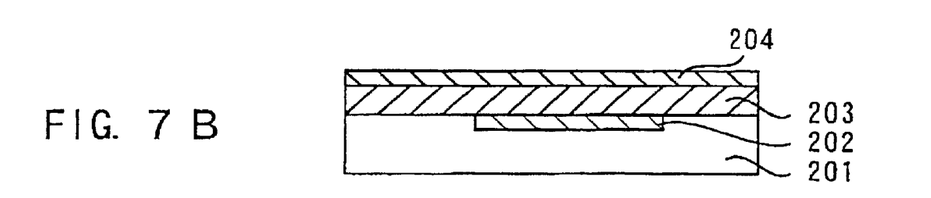
Figure 7C:
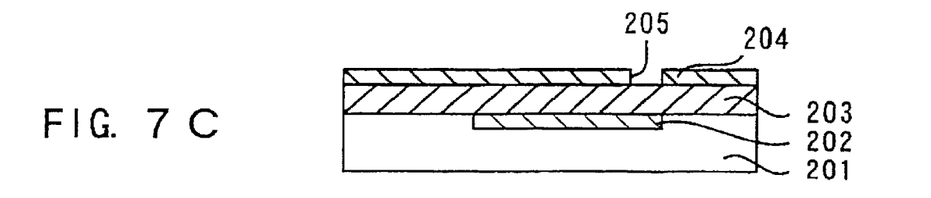
Figure 7D:
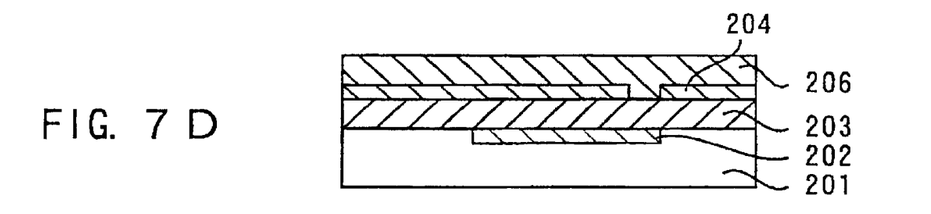
Figure 7E:
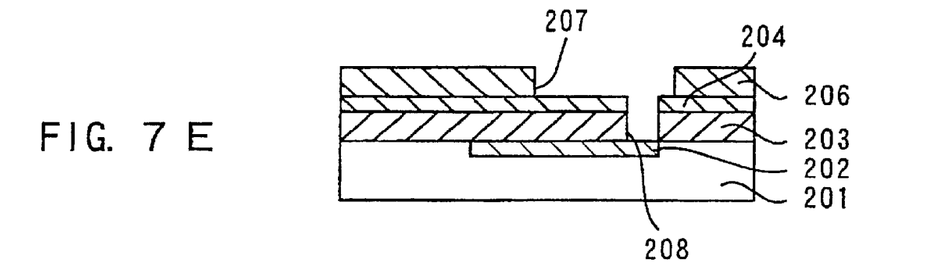
Figure 7F:
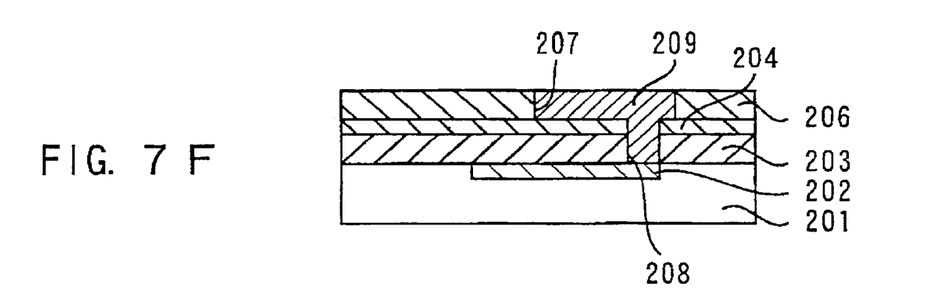

First, a first interlayer insulating film 203 is formed on a semiconductor substrate 201 with a surface area on which first wiring 202 is formed as shown in FIG. 7A. A silicon nitride film as an etching stopper film 204 is formed on the first interlayer insulating film 203 as shown in FIG. 7B. A predetermined area of the etching stopper film 204 is etched. More particularly, only a portion which corresponds to a formation area of a via hole (which will be described later) is selectively etched so as to be removed. An opening part 205 is formed in the etching stopper film 204 (FIG. 7C). Next, a second interlayer insulating film 206 is formed on the first interlayer insulating film 203 and the etching stopper film 204 (FIG. 7D). A wiring trench 207 for forming wiring is formed in a formation area of second wiring by etching the second interlayer insulating film 206. Because the etching stopper film 204 exists, only the second interlayer insulating film 206 is etched. A via hole 208 is formed in the first interlayer insulating film 203 by using the etching stopper film 204 as an etching mask (FIG. 7E). Then, metal materials are laid in the wiring trench 207 and the via hole 208 for forming second wiring 209 so as to complete the semiconductor device (FIG. 7F).

According to such a technique explained above, the etching stopper film 204 is formed above the whole surface of the semiconductor substrate 201 excluding the via hole 208. The etching stopper film 204 necessarily exists between the first wiring 202 and the second wiring 209. In other words, in the above-described manufacturing method, the etching stopper film 204 intervenes between the second wiring 209 and adjacent second wiring 209 (not shown). The etching stopper film 204 is formed of silicon nitride (including silicon oxide nitride).

The silicon nitride film has a higher degree of permittivity than a silicon oxide film which is generally used as an interlayer insulating film. Thus, parasitic capacities between a piece of wiring and another wiring formed on the same layer, and between pieces of wiring formed on different layers are large. Accordingly, a problem arises that the parasitic capacity becomes remarkable in size, as the structure of the wiring is complicated. As the parasitic capacity becomes large in size, reliability in an operation of the semiconductor device decreases.

SUMMARY OF THE INVENTION

Accordingly, an object of the present invention is to provide a semiconductor device whose parasitic capacity between wiring is small.

Another object thereof is to provide a manufacturing method of an improved semiconductor device.

In addition to this, further object thereof is to provide a manufacturing method capable of lowering with an easy method the parasitic capacity of the semiconductor device.

In order to achieve the above-described objects, according to the first aspect of the present invention, there is provided a manufacturing method of a semiconductor device, comprising:

forming a first interlayer insulating film on a semiconductor substrate with a surface area on which first wiring is formed;

forming an etching stopper film made with a material different from a material of the first interlayer insulating film on the first interlayer insulating film;

patterning the etching stopper film so as to remove a portion corresponding to a via hole to be formed in the first interlayer insulating film and a portion corresponding to a peripheral section of second wiring to be formed;

forming a second interlayer insulating film on the etching stopper film;

forming a wiring trench in the second interlayer insulating film by etching the second interlayer insulating film;

forming the via hole in the first interlayer insulating film by etching the first interlayer insulating film by using the patterned etching stopper film as a mask; and forming second wiring connected to the first wiring by laying a conductive material in the via hole and the wiring trench.

In the present invention, the etching stopper film is formed in the wiring trench excluding an area for forming the via hole. An area of the etching stopper film formed between the first wiring and the second wiring is small. Therefore, a parasitic capacity between these wiring formed in different layers becomes small, and the parasitic capacity between those wiring formed in the same layer becomes small.

Each of the first interlayer insulating film and the second interlayer insulating film may comprise a silicon oxide film.

The etching stopper film may comprise an insulating film.

The insulating film may have an etching rate which is smaller than an etching rate of the first interlayer insulating film and of the second interlayer insulating film.

Accordingly, the via hole and the wiring trench may be smoothly formed.

The insulating film may have permittivity which is greater than permittivity of the first interlayer insulating film and of the second interlayer insulating film.

The etching rate of the etching stopper film may become smaller than the etching rate of the interlayer insulating film by using as the etching stopper film an insulting film whose permittivity is greater than permittivity of the interlayer insulating film.

The etching stopper film may comprise an inorganic insulating film.

The etching stopper film may comprise a silicon nitride film or a silicon oxide nitride film.

The etching stopper film may comprise a conductive film.

The conductive film may comprise a metal film or a metal composite film.

An etching rate of the etching stopper film may be lower than an etching rate of the interlayer insulating film, by using the metal film or the metal composite film as the etching stopper film.

A material of the conductive film may comprise a material which is same as a conductive material laid in the vial hole and the wiring trench.

The manufacturing method may further comprise removing the etching stopper film, after the via hole and the wiring trench are formed.

The removing may further include ashing the etching stopper film.

In having such a structure, the etching stopper film may be removed with a photomask which is formed on the second interlayer insulating film for forming the via hole and the wiring trench.

The etching stopper film may comprise an organic insulating film.

The organic insulating film may comprise a photosensitive organic insulating film.

The photosensitive organic insulating film may be patterned only by emitting light, without forming the photomask. That is, if the photosensitive organic insulating film is used as the etching stopper film, the etching stopper film may not only be easily removed, but be easily formed.

The patterning of said etching stopper film may comprise using in a sequential order a first photomask having the pattern corresponding to the via hole and a second photomask having the pattern corresponding to the second wiring.

The patterning of the etching stopper film may include using a photomask which has a pattern corresponding to the via hole and a pattern corresponding to the second wiring.

The patterning of the etching stopper film may further include using a photomask which has a pattern corresponding to the via hole and a pattern corresponding to the second wiring.

According to the second aspect of the present invention, there is provided a semiconductor device comprising:

a first wiring layer;

an interlayer insulating film which is formed on the first wiring layer and which includes via on the first wiring layer;

a dielectric film which is formed on the interlayer insulating film and which comprises a material having permittivity different from permittivity of a material of the interlayer insulating film; and a second wiring layer which is formed on the dielectric film, wherein the dielectric film is formed in an area where the second wiring layer is formed and which excludes an area of the via, and the second wiring is connected to the first wiring via a conductive material laid in the via.

According to the present invention, light emission of a pattern in which two patterns (patterns each corresponding to the via hole and the second wiring) are combined may be performed at once. Due to this, patterning steps may be simply processed.

The dielectric film may be a film having permittivity greater than permittivity of the interlayer insulating film.

The dielectric film may be a conductive film.

The conductive film may be a metal film or a metal composite film.

DETAILED DESCRIPTION OF THE PREFERRED EMBODIMENT

A manufacturing method of a semiconductor device according to the first embodiment of the present invention will now be described with reference to the accompanying drawings.

Figure 1A:
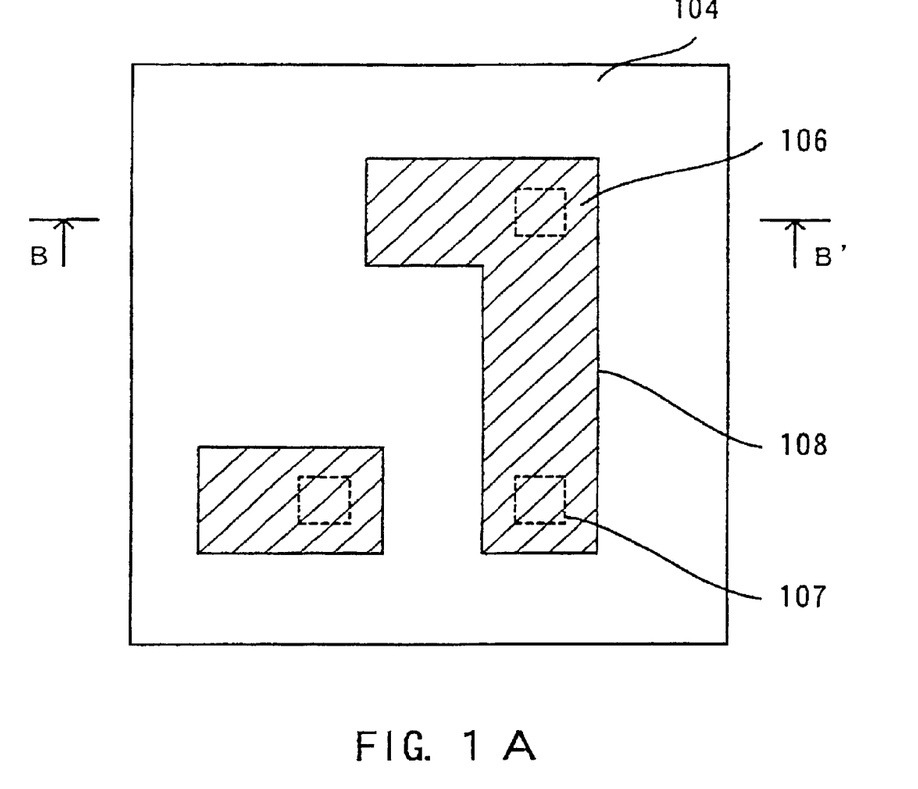
FIG. 1A is a plane view of a semiconductor device manufactured by a manufacturing method according to the first embodiment of the present invention.
Figure 1B:
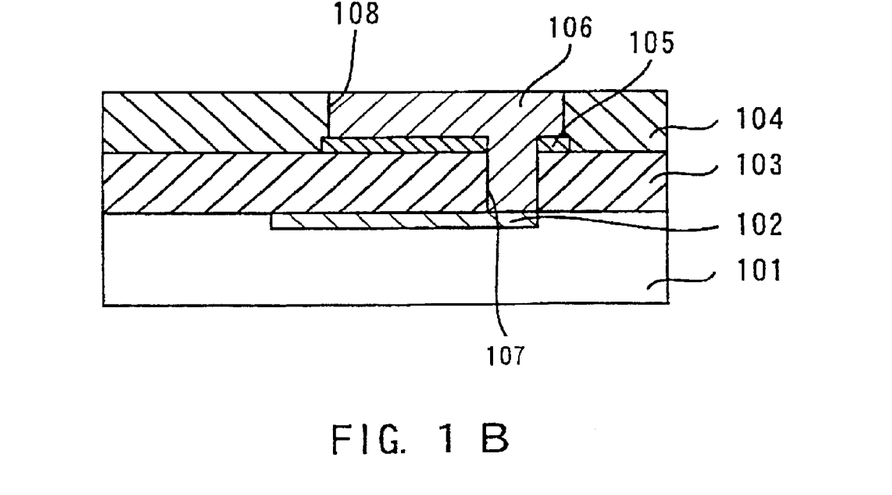
FIG. 1B is a sectional view taken along a line B–B' of FIG. 1A.

FIGS. 1A and 1B are diagrams each showing a structure of a semiconductor device manufactured by a manufacturing method according to the first embodiment of the present invention. More particularly, FIG. 1A is a plane view of the semiconductor device, and FIG. 1B is a cross section taken along a line B–B' of FIG. 1A.

As seen from FIGS. 1A and 1B, the semiconductor device comprises a semiconductor substrate 101, first wiring 102, a first interlayer insulating film 103, a second interlayer insulating film 104, an etching stopper film 105 and second wiring 106.

The semiconductor substrate 101 is a silicon (Si) substrate, for example. Various functional elements (not shown) are formed on a surface of the semiconductor substrate 101. Those functional elements can, for example, be a transistor, a diode, a capacitor, a resistor and the like.

The first wiring 102 includes an electrode part of the functional elements and is formed by implanting an ion into a surface area of the semiconductor substrate 101. The first wiring 102 may be formed only with the electrode part of the functional elements.

The first interlayer insulating film 103 is, for example, a silicon oxide film ($SiO_2$) and is formed on the semiconductor substrate 101 and the first wiring 102. The first interlayer insulating film 103 has a via hole (via) 107 in an area on the first wiring 102.

The second interlayer insulating film 104 is, for example, the silicon oxide film and is formed on the first interlayer insulating film 103. The second interlayer insulating film 104 has a wiring trench 108 in an area including the via hole 107.

The etching stopper film 105 is an inorganic insulating film (for example, a silicon nitride ($Si_3N_4$) film or a silicon oxide nitride film) and Is formed on an area excluding the via hole 107 within the wiring trench 108. More specifically, the etching stopper film 105 is formed on an area in which an area enclosed with dotted lines is excluded from an area shown with oblique lines in FIG. 1A. The area enclosed with the dotted lines is a formation area of the via hole 107, whereas the area shown with the oblique lines is a formation area of the wiring trench 108. The etching stopper film 105 may also function as an etching mask when forming the via hole 107 and as an etching stopper when forming the wiring trench 108. Thus, the thickness of the etching stopper film 105 may be set in accordance with an etching selection ratio of the first interlayer insulating film 103 to the etching stopper film 105 and an etching selection ration of the second interlayer insulating film 104 thereto.

The second wiring 106 is formed in the via hole 107 and the wiring trench 108. The second wiring 106 may be formed of material properties, such as copper (Cu), aluminum (Al) and the like.

A manufacturing method of the semiconductor device having the above-described structure will now be described. Assume that various functional elements (not shown) are pre-formed in the semiconductor substrate 101.

Figure 2A:
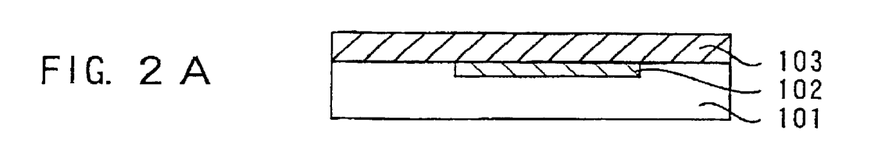
FIGS. 2A to 2F are diagrams each showing a manufacturing step of the semiconductor device.

First, the first wiring 102 is formed on the semiconductor substrate 101 by means of ion implantation. The first interlayer insulating film 103 is formed on the semiconductor substrate 101 and the first wiring 102 by means of a CVD (Chemical Vapor Deposition) technique (FIG. 2A). In a case where the surface of the first interlayer insulation film 103 needs to be very even, it may be done by means of a CMP technique (Chemical Mechanical Polishing).

Figure 2B:
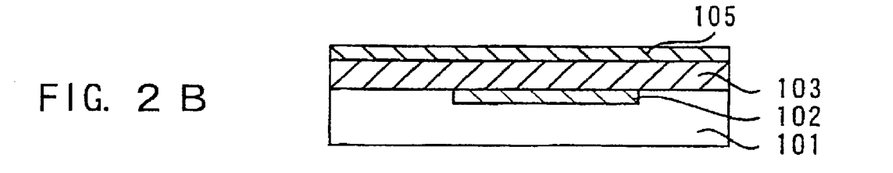
Figure 2C:
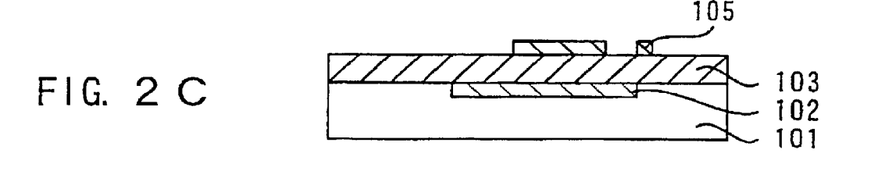
Figure 3A:
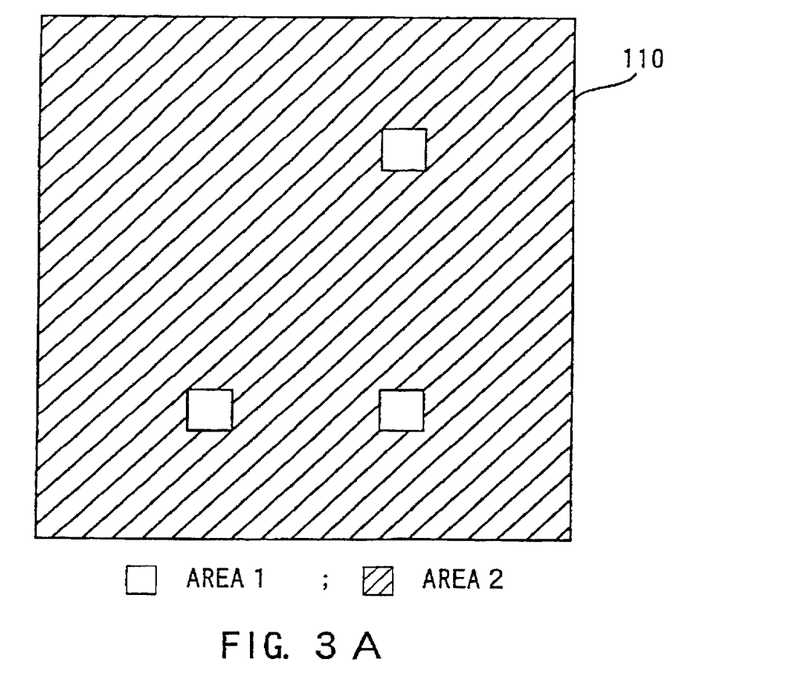
FIGS. 3A and 3B are diagrams each showing a structure of a photomask used for patterning an etching stopper film.
Figure 3B:
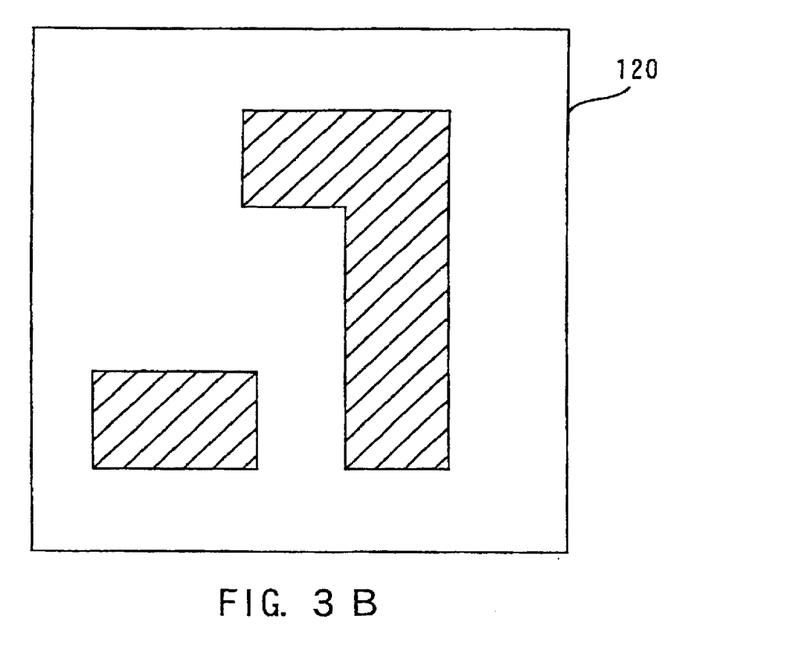

Next, the etching stopper film 105 is formed on the first interlayer insulating film 103 by means of the CVD technique or the like (FIG. 2B). The etching stopper film 105 is patterned by means of a photolithography process and an etching process (FIG. 2C). While the etching stopper film 105 is patterned, two photomasks (reticle) are used. The photomasks include two areas, one of which (Area 1) has a high degree of transmittivity and the other one of which (Area 2) has a low degree of transmittivity. If photoresists are of positive type, two photomasks which are illustrated in FIGS. 3A and 3B are used. Particularly, as seen from FIG. 3A, a first photomask 110 includes an area 1 corresponding to the formation pattern of the via holes 107. A second photomask 120 has areas 2 corresponding to the formation pattern of the wiring trenches 108, as illustrated in FIG. 3B.

In such a case where the etching stopper film 105 is patterned by means of the photolithography technique, photoresist is first formed on the etching stopper film 105. Then, the photoresist is patterned by exposing the first photomask 110 and developing the etching stopper film 105. In using the patterned photoresist as an etching mask, a portion corresponding to a via hole 107 of the etching stopper film 105 is etched to be removed.

After the photoresist on the etching stopper film 105 is removed, another photoresist is again formed on the etching stopper film 105. Then the photoresist is patterned by using the second photomask 120. Continuously, in using the patterned photoresist as the etching mask, a peripheral section corresponding to the wiring trench 108 of the etching stopper film 105 is etched so as to be removed. The patterned etching stopper film 105 which is described in FIG. 2C can be formed.

The first photomask 110 and the second photomask 120 may be used in an order reverse to the above-described order. That is, it is possible to remove the area corresponding to the wiring trench 108 of the etching stopper film 105 prior to the area corresponding to the via hole 107 thereof.

Figure 2D:
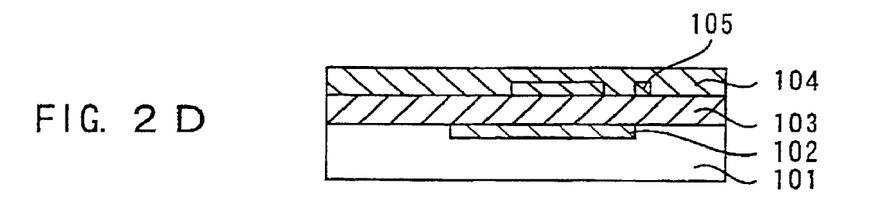

After the etching stopper film 105 is patterned, the photoresist on the etching stopper film 105 is removed. Then the second interlayer insulating film 104 is formed on the first interlayer insulating film 103 and the etching stopper film 105 (FIG. 2D). In this case, the surface of the second interlayer insulating film 104 becomes uneven, depending on the thickness of the etching stopper film 105. Therefore, it is preferred that the surface of the second interlayer insulating film 104 becomes very even by the CMP technique so that the wiring trenches 108 in the second interlayer insulating film 104 can be smoothly formed.

Figure 2E:
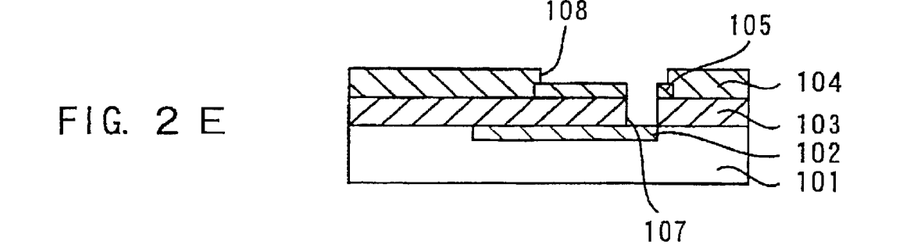

Now, the wiring trench 108 is formed in the second interlayer insulating film 104 by means of the photolithography technique and the etching process (FIG. 2E). In this case, the etching stopper film 105 functions as an etching stopper as described above. Continuously, the etching stopper film 105 is used as an etching mask so as to form the via hole 107 in the first interlayer insulating film 103. The photoresist on the surface of the second interlayer insulating film 104 is removed. An etching gas and an etching liquid by which an etching rate of the etching stopper film 105 is lower compared to those of the first interlayer insulating film 103 and the second interlayer insulating film 104 are selected in this etching process.

Figure 2F:
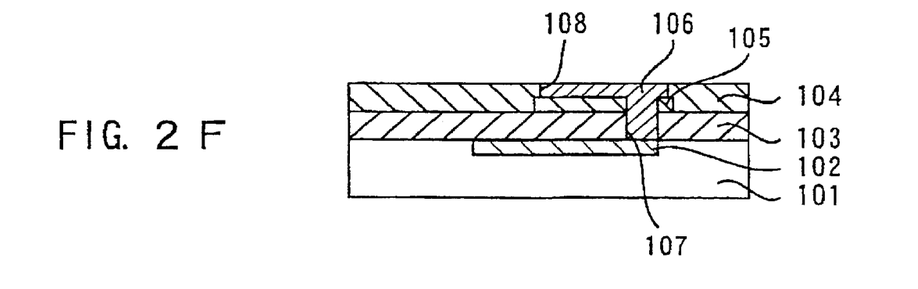

The second wiring 106 is formed in the via hole 107 and the wiring trench 108 by the CVD (FIG. 2F). Now, the second wiring 106 is connected to the first wiring 102 via the via hole 107. The surface of the semiconductor device may smoothly be formed by the CMP technique if necessary.

The semiconductor device illustrated in FIGS. 1A and 1B can be manufactured by the so-far-described manufacturing method. The etching stopper film 105 is formed only on the area corresponding to the second wiring 106. The formation area of the etching stopper film 105 is smaller than that of the conventional etching stopper film. Consequently, a parasitic capacity between the second wiring 106 and adjacent second wiring 106 (not shown) and further a parasitic capacity between the first wiring 102 and the second wiring 106 become smaller than the conventional parasitic capacity.

A manufacturing method of a semiconductor device according to the second embodiment of the present invention will now be described with reference to the accompanying drawings.

The structure of the semiconductor device manufactured by the manufacturing method according to the second embodiment of the present invention is substantially the same as that described in the first embodiment. The manufacturing method according to the second embodiment is substantially the same as that of the first embodiment as well. It should be noted that the etching stopper film 105 in this embodiment is a conductive film, such as a metal film, a metal composite film or the like. The conductive film may be formed of, for example, titanium, tantalum, polycrystalline silicon (or polysilicon), titanium nitride or the like. If the conductive film is used as the etching stopper film 105, its thickness is set depending on an etching selection ratio of the first interlayer insulating film 103 to the etching stopper film 105 and an etching selection ratio of the second interlayer insulating film 104 thereto. It is preferred, however, that the thickness of the etching stopper film 105 is equal to or smaller than 100 nm so as to form the via hole 107 and the wiring trench 108 each in an appropriate position above the lower layer structure (the first wiring 102).

As explained above, the conductive film (the etching stopper film 105) is formed only on an area excluding the via hole 107 within the wiring trench 108. In other words, the etching stopper film with a high degree of permittivity does not exist above the whole surface of the semiconductor substrate 101, unlike the conventional semiconductor device. The parasite capacity between the second wiring 106 and the adjacent second wiring 106 (not shown) and further the parasitic capacity between the first wiring 102 and the second wiring 106 are smaller than those of the prior art. If the etching stopper film 105 is made with the conductive film, the etching selection rate during the formation of the via hole 107 is high. Thus, the via hole 107 may be formed with high accuracy.

A manufacturing method of a semiconductor device according to the third embodiment of the present invention will now be described with reference to the accompanying drawings.

Figure 4A:
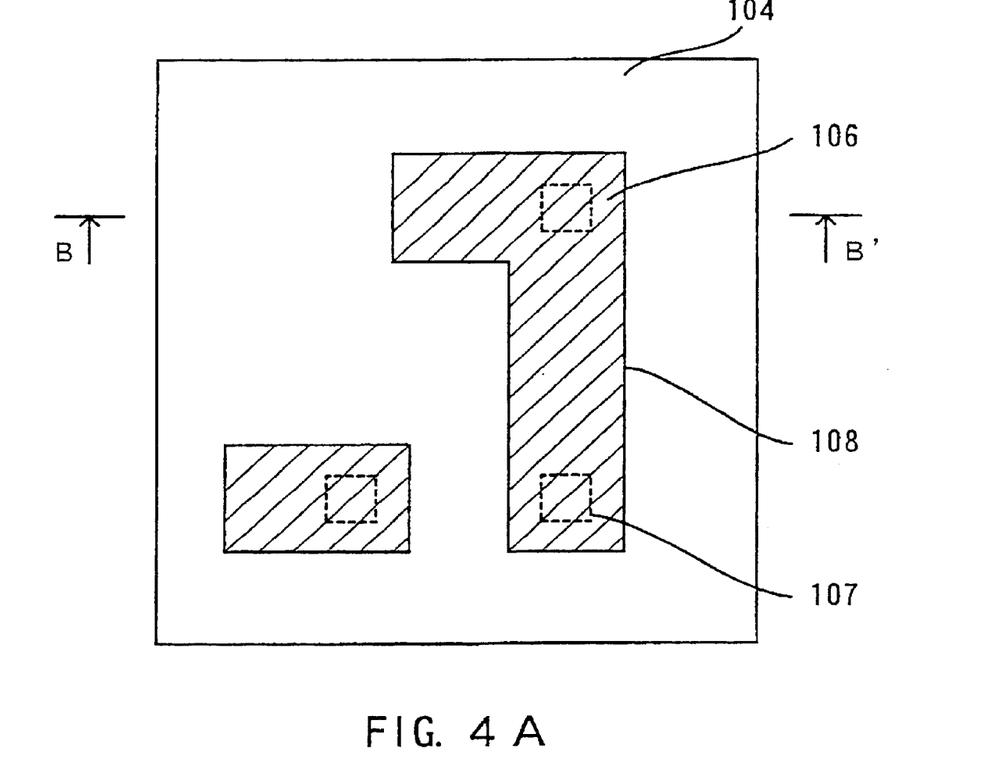
FIG. 4A is a plane view of a semiconductor device manufactured by a manufacturing method according to the second embodiment of the present invention.
Figure 4B:
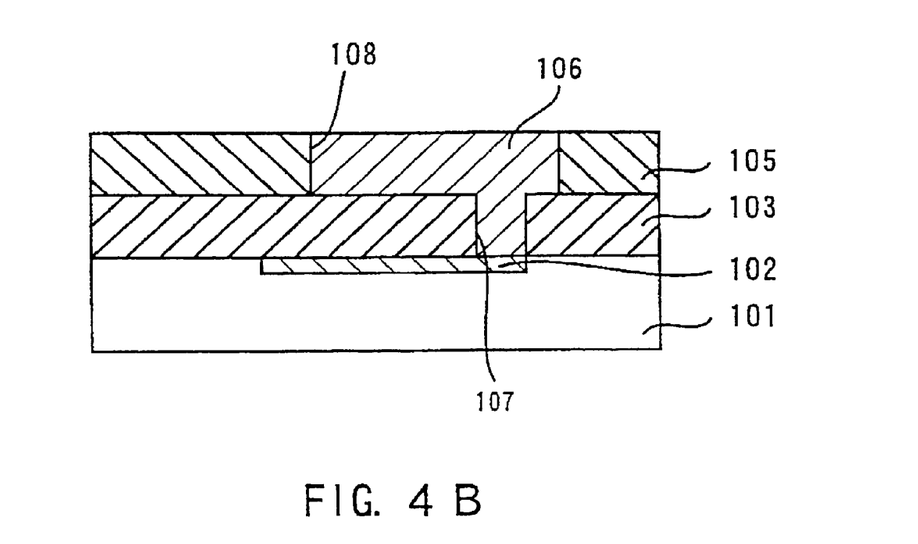
FIG. 4B is a sectional view taken along a line B–B' of FIG. 4A.

The structure of the semiconductor device manufactured by the manufacturing method according to the third embodiment of the present invention is that shown in FIGS. 4A and 4B. More particularly, the semiconductor device has the structure which is substantially the same as those of the first and the second embodiments, except for the etching stopper film 105 excluded from the device.

Figure 5A:
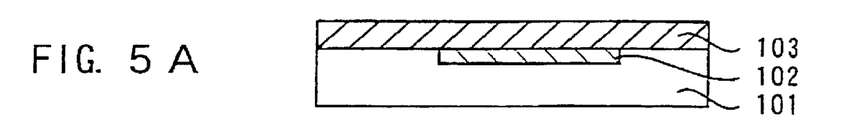
FIGS. 5A to 5F are diagrams each showing a manufacturing step of the semiconductor device.
Figure 5B:
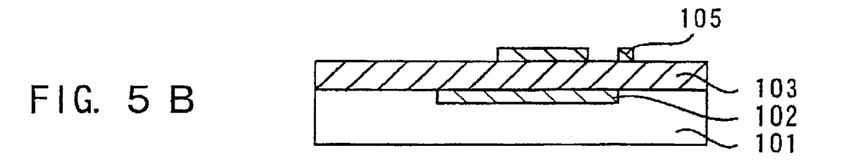
Figure 5C:
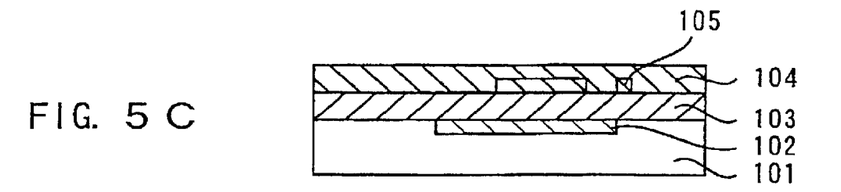
Figure 5D:
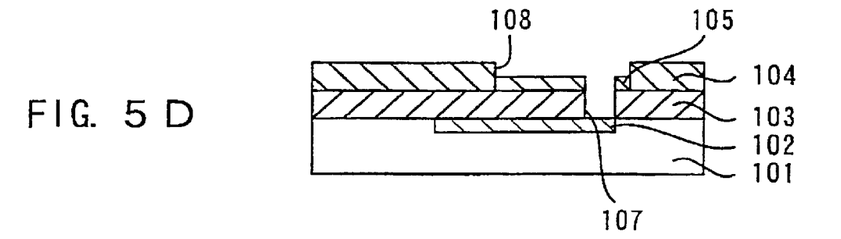

The manufacturing method of the semiconductor device having the above-described structure will now be explained, First, the first wiring 102 and the first interlayer insulating film 103 are formed on the semiconductor substrate 101 as done in the first embodiment (FIG. 5A). Next, the etching stopper film 105 is formed on the first interlayer insulating film 103 as in the first embodiment. (FIG. 5B). The etching stopper film 105 is formed of organic insulation, for example, polyimide. The formation pattern of the etching stopper film 105 is substantially the same as that described in the first embodiment. The second interlayer insulating film 104 is formed on the first interlayer insulating film 103 and the etching stopper film 105 as formed in the first embodiment (FIG. 5C). Then, the via hole 107 and the wiring trench 108 are formed as described in the first embodiment (FIG. 5D).

Figure 5E:
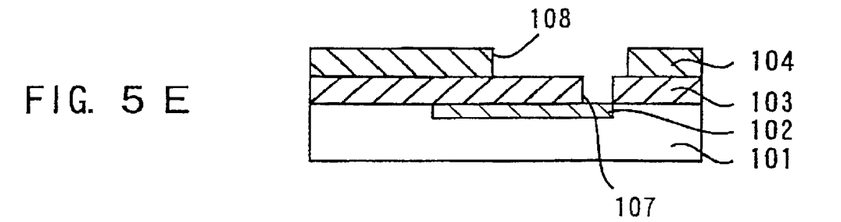

In a case where the wiring trench 108 is formed by the photolithography, the photoresist remains on the surface of the second interlayer insulating film 104, right after the via hole 107 and the wiring trench 108 are formed. In the third embodiment, the photoresist is removed by an ashing process using oxygen plasma. Since the etching stopper film 105 is the organic insulating film, it can be removed, together with the photoresist (FIG. 5E).

Figure 5F:
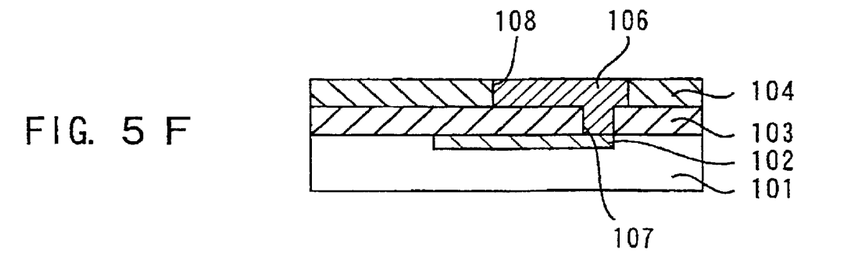

After the etching stopper film 105 is removed, the second wiring 106 is formed in the via hole 107 and the wiring trench 108 (FIG. 5F).

By all accounts, the semiconductor device shown in FIGS. 4A and 4B can be manufactured. The etching stopper film 105 is removed together with the photoresist, and the etching stopper film 105 does not exist. Therefore, the parasitic capacity between the second wiring 106 and the adjacent second wiring 106 (not shown), and between the first wiring 102 and the second wiring 106 by the etching stopper film 105 does not exist.

A manufacturing method of a semiconductor device according to the fourth embodiment of the present invention will now be described with reference the accompanying drawings.

The structure of the semiconductor device manufactured by the manufacturing method according to the fourth embodiment of the present invention is substantially the same as that of the semiconductor device described in the third embodiment. The manufacturing method of the semiconductor device according to the fourth embodiment is substantially the same as that described in the third embodiment. In this fourth embodiment, however, the etching stopper film 105 is made of organic insulating including a photosensitive resin, that is, the etching stopper film 105 is, for example, a positive type photosensitive polyimide film.

Therefore, a photoresist film for patterning the etching stopper film 105 is not necessarily formed. The etching stopper film 105 is formed on the whole surface of the first interlayer insulating film 103 by the CVD as done in the third embodiment. Light is emitted to the etching stopper film 105 via the photomask, and the etching stopper film 105 is patterned as a result of developing the film. The etching stopper film 105 can be patterned without using the photoresist. That is, formation steps of the etching stopper film 105 may easily be performed. After the light emission to the etching stopper film 105, a baking process can be performed.

The manufacturing method according to the fourth embodiment Is substantially the same as that described in the third embodiment, except for forming the etching stopper film 105.

As explained, the etching stopper film 105, that is, the semiconductor device can easily be formed according to the above-described methods. The etching stopper film 105 is removed after the via hole 107 and the wiring trench 108 are both formed. Thus, the etching stopper film 105 does not exist. Therefore, the parasitic capacity between the second wiring 106 and the adjacent second wiring 106 (not shown), and between the first wiring 102 and the second wiring 106, does not exist by the etching stopper film 105.

Figure 6:
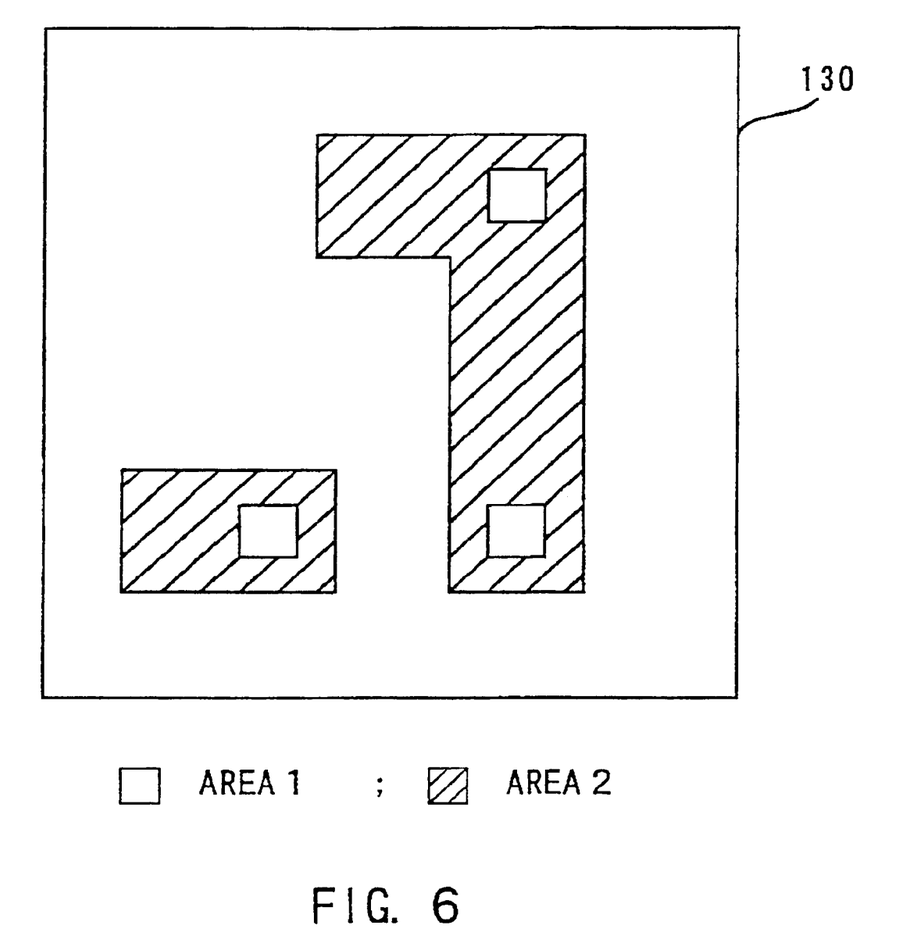
FIG. 6 is a diagram showing a structure of a photomask used for patterning the etching stopper film.

In any one of the four embodiments, the first to the fourth, a single photomask may be used for forming the etching stopper film 105, instead of those two photomasks described in FIGS. 3A and 3B. More particularly, a photomask (reticle) 130, in which the two photomasks shown in FIGS. 3A and 3B overlap with each other as described in FIG. 6, can be used for forming the etching stopper film 105. That is, the photomask 130 having areas B, in each of which the portion corresponding to the via hole 107 is eliminated from the portion corresponding to the wiring trench 108 formation area, can be employed. By using such a photomask 130, the formation process of the etching stopper film 105 is formed more easily than that described in the above-described embodiments. The size of the area corresponding to the via hole 107 and the wiring trench 108 may be revised depending on the actual size of the via hole 107 and the wiring trench 108. As the wiring pattern is complicated even more, the photomask is revised to widen the area corresponding to the wiring trench 108 so that the via hole 107 and the wiring trench 108 can accurately be formed in the lithography process.

The etching stopper film 105 described in the second embodiment remains as to be a part of the second wiring 106. Thus, the etching stopper film 105 should preferably be made of materials with a high degree of reliability. Particularly, it is preferred that the materials with such characteristics, as having a low resistance and being not corrosive, are selected. The materials of the etching stopper film 105 may have conductivity which may be different from or identical with that of the second wiring 106.

In the third and fourth embodiments, the second wiring 106 may be formed without removing the organic insulating film as the etching stopper film 105. The organic insulating film may have a smaller degree of permittivity than that of the inorganic insulating film described in the first embodiment. Due to this, if the second wiring 106 is formed without removing the etching stopper film 105, the parasitic capacity can become even more smaller than that described in the first embodiment.

In the above-described embodiments, explanations have been made to the case where the wiring is made by the two layers, the first wiring 102 and the second wiring 106. However, even if the wiring is made by three or more layers, the present invention can be applied likewise the above.

This application is based on Japanese Patent Application No. H10-151552 filed on Jun. 1, 1998, which is incorporated herein by reference in its entirety.

What is claimed is:

1. A semiconductor device comprising:
   a first wiring layer;
   an interlayer insulating film which is formed on said first wiring layer and which has a via on said first wiring layer;
   a dielectric film which is formed on said interlayer insulating film and which comprises a material having permittivity different from permittivity of a material of said interlayer insulating film; and
   a second wiring layer which is formed on said dielectric film,
   wherein said dielectric film is formed only in an area where said second wiring layer is formed and where an area of said via is excluded, and
   said second wiring is connected to said first wiring via a conductive material laid in said via.

2. The semiconductor device according to claim 1, wherein said dieletric film is a film having permittivity greater than permittivity of said interlayer insulating film.

3. A semiconductor device comprising:
   a first wiring layer;
   an interlayer insulating film disposed on the first wiring layer, the interlayer insulating film comprising a via arranged in communication with the first wiring layer;
   a dielectric film disposed in direct contact with the interlayer insulating film, the dielectric film having a permittivity different from a permittivity of a material of the interlayer insulating film, the dielectric film comprising a via arranged in communication with the first wiring layer;
   a second wiring layer disposed on top of and in direct contact with the dielectric film; and
   a conductive material disposed in the via to electrically connect the first and second wiring layers;
   wherein the dielectric film is disposed so that, in plan view, a perimeter of the dielectric film follows a perimeter of the second wiring layer.

4. The semiconductor device according to claim 3, wherein the permittivity of the dielectric film is greater than the permittivity of the interlayer insulating film.

5. The semiconductor device of claim 3, wherein the dielectric film is a silicon nitride film.

6. The semiconductor device of claim 3, wherein the dielectric film is a silicon oxide nitride film.

7. A semiconductor device comprising:
   a first wiring layer;
   an interlayer insulating film which is formed on said first wiring layer and which has a via on said first wiring layer;
   a etching stopper film which is formed on said interlayer insulating film and which comprises a material having permittivity different from permittivity of a material of said interlayer insulating film; and
   a second wiring layer which is formed on said etching stopper film,
   wherein said etching stopper film is formed only in an area where said second wiring layer is formed and where an area of said via is excluded, and
   said second wiring is connected to said first wiring via a conductive material laid in said via.

8. The semiconductor device according to claim 7, wherein said etching stopper film is a film having permittivity greater than permittivity of said interlayer insulating film.

9. The semiconductor device according to claim 7, wherein said etching stopper film is a conductive film.

10. The semiconductor device according to claim 9, wherein said conductive film is a metal film or a metal composite film.

11. A semiconductor device comprising:
    a first wiring layer;
    an interlayer insulating film disposed on the first wiring layer, the interlayer insulating film comprising a via arranged in communication with the first wiring layer;
    an etching stopper film disposed in direct contact with the interlayer insulating film, the etching stopper film having a permittivity different from a permittivity of a material of the interlayer insulating film;
    a second wiring layer disposed in direct contact with the etching stopper film; and
    a conductive material disposed in the via to electrically connect the first and second wiring layers;
    wherein the etching stopper film is disposed so that, in plan view, a perimeter of the etching stopper film follows a perimeter of the second wiring layer.

12. The semiconductor device according to claim 11 wherein the permittivity of the etching stopper film is greater than the permittivity of the interlayer insulating film.

13. The semiconductor device according to claim 11, wherein said etching stopper film is a conductive film.

14. The semiconductor device according to claim 13, wherein said conductive film is a metal film or a metal composite film.

15. A semiconductor device comprising:
    a first wiring layer;
    an interlayer insulating film disposed on the first wiring layer, the interlayer insulating film comprising a via arranged in communication with the first wiring layer;
    an etching stopper film disposed in direct contact with the interlayer insulating film, the etching stopper film having a permittivity different from a permittivity of a material of the interlayer insulating film;
    a second wiring layer disposed in direct contact with the etching stopper film; and
    a conductive material disposed in the via to electrically connect the first and second wiring layers;
    wherein the etching stopper film is disposed so that, in plan view, a perimeter of the etching stopper film follows a perimeter of the second wiring layer;
    wherein the etching stopper film is a silicon nitride film.

16. A semiconductor device comprising:
    a first wiring layer;
    an interlayer insulating film disposed on the first wiring layer, the interlayer insulating film comprising a via arranged in communication with the first wiring layer;
    an etching stopper film disposed in direct contact with the interlayer insulating film, the etching stopper film having a permittivity different from a permittivity of a material of the interlayer insulating film;
    a second wiring layer disposed in direct contact with the etching stopper film; and
    a conductive material disposed in the via to electrically connect the first and second wiring layers;
    wherein the etching stopper film is disposed so that, in plan view, a perimeter of the etching stopper film follows a perimeter of the second wiring layer;
    wherein the etching stopper film is a silicon oxide nitride film.

* * * * *